United States Patent [19]
Bijker et al.

[11] Patent Number: 5,341,107
[45] Date of Patent: Aug. 23, 1994

[54] FM QUADRATURE DEMODULATOR WITH TWO PHASE COMPARISON CIRCUITS

[75] Inventors: Wolter Bijker; Wolfdietrich G. Kasperkovitz; Hendricus C. De Ruytere; Willem-Arie Sloof, all of Eindhoven, Netherlands

[73] Assignee: U.S. Philips Corporation, New York, N.Y.

[21] Appl. No.: 47,216

[22] Filed: Apr. 14, 1993

[30] Foreign Application Priority Data

Jun. 12, 1992 [EP] European Pat. Off. ......... 92201732.2

[51] Int. Cl.$^5$ .................................................. H03D 3/06
[52] U.S. Cl. .................................... 329/337; 329/319; 329/321; 329/336; 455/214
[58] Field of Search ............... 329/315, 310, 319, 320, 329/321, 336, 337; 455/205, 207, 214

[56] References Cited

U.S. PATENT DOCUMENTS

| 4,035,730 | 7/1977 | Clayton | 329/321 X |
| 4,618,967 | 10/1986 | Vance et al. | 455/214 X |
| 4,754,228 | 6/1988 | Tomlinson | 329/336 X |
| 4,914,408 | 4/1990 | Voorman | 333/167 |
| 5,197,085 | 3/1993 | Luff et al. | 375/88 |
| 5,220,686 | 6/1993 | Kasperkovitz et al. | 455/234.1 |

FOREIGN PATENT DOCUMENTS 2636268 2/1977 Fed. Rep. of Germany .

OTHER PUBLICATIONS

Ishigaki, M. et al.; "A Phase-Tracking Loop (PTL) Detector For FM Signals And Its Application To An FM Receiver" *IEEE Trans. Cons. Elec.* (USA) vol. CE-24, No. 3 (Aug. 1978) pp. 215-216.

*Primary Examiner*—David Mis
*Attorney, Agent, or Firm*—Edward W. Goodman

[57] ABSTRACT

FM quadrature demodulator having in-phase and quadrature terminals for applying a pair of FM-modulated signals in a mutual phase quadrature thereto, having a modulation signal which is frequency-modulated on a carrier, one of the two terminals being coupled to a first input of a first phase comparison circuit and the other terminal being coupled to a second input of the first phase comparison circuit via a first phase-shifting circuit which realizes a phase shift varying with said modulation signal, the first phase comparison circuit being connected to an output of the FM quadrature demodulator via a low-pass filter. In order to enhance, inter alia, the signal processing and the field of use of the FM quadrature demodulator, this demodulator includes a second phase comparison circuit having first and second inputs, in which one of the two in-phase and quadrature terminals is coupled to the first input of the second phase comparison circuit and the other terminal is coupled to the second input of the second phase comparison circuit via a second phase-shifting circuit which realizes a phase shift varying with the modulation signal, the FM quadrature demodulator also having a differential stage which is coupled between outputs of the two phase comparison circuits and an input of the low-pass filter.

9 Claims, 2 Drawing Sheets

FM QUADRATURE DEMODULATOR WITH TWO PHASE COMPARISON CIRCUITS

BACKGROUND OF THE INVENTION

1. Field of the Invention

The invention relates to an FM quadrature demodulator having in-phase and quadrature terminals for applying a pair of FM-modulated signals in a mutual phase quadrature thereto, comprising a modulation signal which is frequency-modulated on a carrier, one of the two terminals being coupled to a first input of a first phase comparison circuit and the other terminal being coupled to a second input of the first phase comparison circuit via a first phase-shifting circuit which realises a phase shift varying with said modulation signal, said first phase comparison circuit being connected to an output of the FM quadrature demodulator via a low-pass filter.

2. Description of the Related Art

An FM quadrature demodulator of this type is known per se, for example from German Patent Application no. 26 36 268.

The in-phase terminal of the known FM quadrature demodulator functions as a demodulator input. Via this in-phase terminal, an FM-modulated input signal is applied to a first-order differential network preceding a limiter, as well as to a first phase-shifting circuit.

The first-order differential network is used for a more or less frequency-independent 90° phase shift of the FM-modulated input signal, but also realizes a signal gain which increases with the frequency. This frequency-dependent signal gain is eliminated by means of the limiter, so that an FM-modulated signal, which is in phase quadrature with respect to the FM-modulated input signal, is obtained at the output of the limiter. The FM-modulated quadrature signal is applied to the first input of the first phase comparison circuit via the output of the limiter which functions as a quadrature terminal of the known FM quadrature demodulator.

The first phase-shifting circuit of the known FM quadrature demodulator realizes a frequency-dependent phase shift of the FM-modulated input signal applied to the input terminal, or in-phase terminal, with an average phase shift of zero degrees at the frequency of said carrier. The output signal of the first phase-shifting circuit is subsequently applied to the second input of the first phase comparison circuit. The two FM-modulated signals applied to the first and second inputs are multiplied by each other in the first phase comparison circuit. The desired baseband modulation signal of the FM-modulated input signal is obtained in the DC component of the product of the two last-mentioned FM-modulated signals. This baseband modulation signal will be available at the output of this first phase comparison circuit and is applied to the output of the known FM quadrature demodulator after a selection in the low-pass filter.

However, as a result of the multiplication, higher order interference components are also produced in the known FM quadrature demodulator. Of these components, the frequency of the second-order interference component is closest to the desired DC component and generally has the largest amplitude with respect to the other interference components. An effective suppression of this second-order interference component can be obtained by making use of a low-pass filter having a higher-order slope. However, such a filter is difficult to integrate and costly. Moreover, such a filter realizes a comparatively large phase shift which considerably restricts the field of use of the known FM quadrature demodulator.

SUMMARY OF THE INVENTION

It is an object of the invention to provide an FM quadrature demodulator of the type described in the opening paragraph which is, inter alia applicable in a much larger field than the known FM quadrature demodulator, in which at least the second-order interference component is avoided in an effective manner, and which provides the possibility of realizing a linear signal processing over a relatively large frequency deviation range in a simple manner.

According to the invention, an FM quadrature demodulator is therefore characterized by a second phase comparison circuit having first and second inputs, in which one of the two in-phase and quadrature terminals is coupled to the first input of the second phase comparison circuit, and the other terminal is coupled to the second input of the second phase comparison circuit via a second phase-shifting circuit which realises a phase shift varying with said modulation signal, said FM quadrature demodulator also comprising a differential stage which is coupled between outputs of the two phase comparison circuits and an input of the low-pass filter.

When the measure according to the invention is used, the desired DC component at the output of the first phase comparison circuit is in phase opposition with respect to the desired DC component at the output of the second phase comparison circuit, while the second-order interference component at the output of the first phase comparison circuit occurs in the same phase with respect to that at the output of the second phase comparison circuit. By subtracting the output signals of the two phase comparison circuits from each other, a compensation of the second-order interference component is obtained, while simultaneously the desired DC components are summed. The requirements which are notably imposed on the slope of the low-pass filter succeeding the differential stage can thereby be reduced considerably. Consequently, the low-pass filter may be of a lower order than in the known FM quadrature demodulator. Such a low-pass filter can be implemented in a simple and inexpensive manner in an integrated form. Moreover, the phase shift in such a simple low-pass filter is comparatively small so that this FM quadrature demodulator according to the invention may be used in feedback systems without the risk of instability.

Such an FM quadrature demodulator according to the invention is preferably characterized in that the first and second phase-shifting circuits are part of a polyphase filter having a bandpass characteristic which is symmetrical around the carrier frequency, comprising in-phase and quadrature inputs and outputs, the polyphase filter from in-phase input to in-phase output being arranged between the in-phase terminal and the second input of the first phase comparison circuit and from quadrature input to quadrature output being arranged between the quadrature terminal and the second input of the second phase comparison circuit, the in-phase and quadrature input terminals being coupled to the first inputs of the second and first phase comparison circuits, respectively.

When this measure is used, distortion due to asymmetry in the passband of the phase-shifting circuits is prevented from occurring, also at a relatively large frequency swing. Moreover, such a polyphase filter has a point-symmetrical phase transfer characteristic around the resonant frequency so that second-order distortion components are avoided. These filter characteristics are maintained, even at a very low value of the resonant frequency. The tuning frequency of the FM quadrature demodulator according to the invention, and hence the carrier frequency of the FM signals to be demodulated, may therefore be chosen to be relatively low so that a considerable integration and simplification of the FM quadrature demodulator is possible.

Moreover, the polyphase filter accurately realizes and maintains the phase quadrature relation which is essential for an effective interference compensation between the FM-modulated signals applied to the first and second inputs of the first and second phase comparison circuits, respectively, also at a relatively large frequency swing. Such polyphase filters are known per se, for example from European Patent Applications EP 0 344 852 and EP 0 420 974, corresponding to U.S. Pat. Nos. 4,914,408 and 5,220,686, respectively.

In order to render a further filter integration possible while maintaining the above-mentioned effective interference suppression and favourable distortion properties, a resonance amplifier as is known from the last-mentioned European Patent Application EP 0 420 974 is preferably used in the last-mentioned FM receiver according to the invention. Such a preferred embodiment is therefore characterized in that the polyphase filter comprises a first resonance amplifier which has in-phase and quadrature inputs and outputs in common with the polyphase filter, the first resonance amplifier from in-phase input to in-phase output being arranged between the in-phase terminal and the second input of the first phase comparison circuit and from quadrature input to quadrature output being arranged between the quadrature terminal and the second input of the second phase comparison circuit, the in-phase and quadrature input terminals being coupled to the first inputs of the second and first phase comparison circuits, respectively.

A further preferred embodiment of such an FM quadrature demodulator according to the invention is characterized in that the first resonance amplifier is tunable and has a tuning control input for applying a tuning control signal thereto, said first resonance amplifier being arranged in a first tuning control loop comprising a first tuning control path via which the low-pass filter is coupled to the tuning control input of the first resonance amplifier. This measure is based on the recognition that a tunable resonance amplifier, which is known from the last-mentioned European Patent Application EP 0 420 974, is eminently suitable for use in a feedback quadrature concept. The resonant frequency of such a resonance amplifier varies linearly with the tuning control signal so that non-linearities in the tuning control loop are prevented.

When this measure is used, the tuning control loop, which is known per se from the first-mentioned patent publication, is used to cause the tuning of the resonance amplifier to track the modulation signal. Consequently, the FM-modulated input signal covers a relatively small part of the response curve of the resonance amplifier, thereby obtaining a further linearization of the demodulation effect, which provides the possibility of further decreasing the carrier frequency. Since in a resonance amplifier a tuning variation does not have any influence on other parameters such as bandwidth and phase quadrature relation, the improvement of the linearization obtained by means of the control loop is not disturbed by changes of the filter parameters as a result of the tuning variation.

Moreover, the use of the tunable resonance amplifier prevents signal limitations in at least one of the two FM signals applied to the first and second phase comparison circuits. A result is that fewer higher order interference components are produced as compared with the known FM quadrature demodulator.

A further preferred embodiment of the FM quadrature demodulator according to the invention is characterized in that the low-pass filter in the first tuning control path precedes an amplifier-limiter whose level of limitation corresponds to the level of the tuning control signal at the order of magnitude of the maximum frequency deviation of the pair of FM-modulated phase quadrature signals.

When this measure is used, it is prevented in a simple manner that disturbances occur as a result of the tuning control capturing a neighboring transmitter signal when the desired FM-modulated signal instantaneously approximates this neighboring transmitter signal in frequency. Since said amplifier-limiter (also referred to as soft limiter) gradually decreases in amplification with an increasing input signal amplitude, the loop gain with a neighboring transmitter carrier instantaneously approximating in frequency gradually decreases without the loop gain becoming zero. Such an amplifier-limiter can be realized in a manner known per se by means of a differential amplifier. This amplifier supplies an output signal whose amplitude monotonically increases with an increasing input signal and, due to saturation phenomena, asymptotically approximates a given limitation level at an input signal amplitude which increases towards infinity. At said choice of the limitation level, a neighboring carrier dominantly occurring within the capturing range of the tuning control loop can only disturb the demodulation effect for the duration of this dominant occurrence. In practice these frequency breakthroughs rarely occur and if they do, only for a short period because this depends on the mutual amplitude and frequency modulation of the desired carrier and the neighboring carrier. A soon as this neighboring carrier is beyond said capturing range, for example as a result of the frequency modulation occurring on this carrier and/or as soon as its amplitude becomes smaller than the desired carrier, the tuning control loop immediately captures the desired carrier without any transient phenomena.

A further reduction of the higher order interference components is possible in a further preferred embodiment of the FM quadrature demodulator according to the invention. To this end, this demodulator is characterized by a second tunable resonance amplifier having in-phase and quadrature inputs and outputs and a tuning control input, said last-mentioned in-phase and quadrature inputs being coupled to the in-phase and quadrature terminals, respectively, of the FM quadrature demodulator and said last-mentioned in-phase and quadrature outputs being coupled to the first inputs of the first and second phase comparison circuits, respectively, said second tunable resonance amplifier being arranged in a second tuning control loop comprising a second tuning control path via which the low-pass filter is coupled to the tuning control input of the second resonance amplifier, the loop gain in the first tuning control loop deviating from that in the second.

When this measure is used, an adequate demodulation effect is maintained and the two FM signals apply to the first and second phase comparison circuits are sinusoidal. Consequently, the occurrence of higher order interference components is avoided and the low-pass filter can be dispensed with. By dispensing with the low-pass filter, the control rate can be raised considerably.

If a large control rate is of lesser importance, it is possible to reduce distortion due to unwanted amplitude variations by limiting the signals applied to the phase comparison circuits.

The gain in the tuning control loops can be set to mutually different values by choosing the tuning control slope and/or the bandwidth of the first tunable resonance amplifier to be different with respect to that of the second tunable resonance amplifier. It is alternatively possible to provide the first and second tuning control paths with first and second loop amplifiers having mutually different gain factors for this purpose.

Another preferred embodiment of the FM quadrature demodulator according to the invention is characterized by a third tunable resonance amplifier having in-phase and quadrature inputs mutually coupled to a common input terminal of the FM quadrature demodulator and in-phase and quadrature outputs which are coupled to said in-phase and quadrature terminals, and a tuning control input, the output of the FM quadrature demodulator being coupled to the last-mentioned tuning control input via an attenuator circuit.

When this measure is used, a pair of phase quadrature FM-modulated signals is derived in a simple manner from a single-phase FM-modulated input signal. Due to the dynamic tuning control of the third resonance amplifier, its resonant frequency tracks the modulation signal so that the bandwidth of this third resonance amplifier can be reduced considerably, which enhances the phase quadrature relation. Instabilities in the tuning control loop are prevented by means of the attenuator circuit.

In another preferred embodiment an FM quadrature demodulator according to the invention is characterized in that in the signal direction preceding each of the two inputs of the first and second phase comparison circuits a mixer stage is arranged for an up-conversion of the input signals of said first and second phase comparison circuits, mutually equal first mixing signals being applied to the mixer stages coupled to the first and second inputs of the first phase comparison circuit and mutually equal second mixing signals being applied to the mixer stages coupled to the first and second inputs of the second phase comparison circuit, said first and second mixing signals being mutually in phase quadrature.

When this measure is used, the frequency interval between the desired DC component and the undesired higher order interference component which is next in frequency is increased in the output signal of the differential stage by twice the mixing frequency of the first and second phase quadrature mixing signals. This renders a further simplification of the low-pass filter possible.

BRIEF DESCRIPTION OF THE DRAWINGS

These and other aspects of the invention will be apparent from and elucidated with reference to the embodiments described hereinafter.

In the drawings.

DESCRIPTION OF THE PREFERRED EMBODIMENTS

Figure 1:
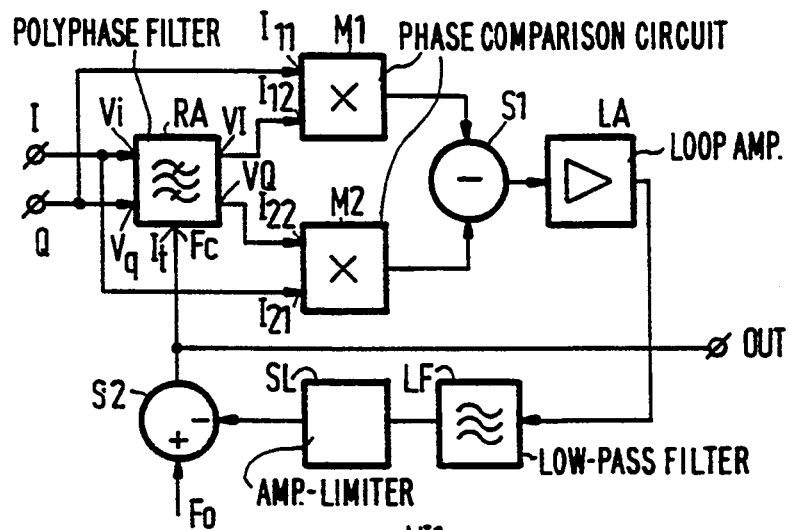
FIG. 1 shows a first embodiment of an FM quadrature demodulator according to the invention.

FIG. 1 shows an FM quadrature demodulator according to the invention, having in-phase and quadrature terminals I and Q for applying a pair of FM-modulated signals in a mutual phase quadrature thereto, comprising a modulation signal fmod frequency-modulated on a carrier frequency f0, for example an FM multiplex signal, a resonance amplifier RA functioning as a polyphase filter and having in-phase and quadrature inputs Vi and Vq and in-phase and quadrature outputs VI and VQ, first and second multiplier stages M1 and M2 operating as first and second phase comparison circuits with first and second inputs I11 and I12, I21 and I22, respectively, a first differential stage S1 having successively coupled thereto a loop amplifier LA, a low-pass filter LF operating as a loop filter, an emitter coupled differential amplifier operating as an amplifier-limiter or soft limiter SL and a second differential stage S2. The amplification of the amplifier-limiter SL gradually decreases with an increasing input voltage, such that the output voltage monotonically increases (for example, in accordance with a tangent hyperbola function) with an increasing value of the input voltage and due to saturation phenomena asymptotically approximates a given limitation value at an input voltage amplitude increasing towards infinity. The choice of the limitation value will be further dealt with hereinafter. Such a differential amplifier is known per se to those skilled in the art and does not require any detailed description for the explanation of the invention.

An output of the differential stage S2 is connected to an output OUT of the FM quadrature demodulator and to a tuning control input It of the resonance amplifier RA for a dynamic tuning control of this resonance amplifier RA. A frequency setting signal F0 is applied to the second differential stage S2 for a simple setting of the tuning of the FM quadrature demodulator or the resonant frequency fres of the resonance amplifier RA at the carrier frequency f0.

In the embodiment shown, the quadrature terminal Q is coupled to the first input I11 of the first multiplier stage M1 and to the quadrature input Vq of the resonance amplifier RA. The in-phase terminal I is coupled to the first input I21 of the second multiplier stage M2 and to the in-phase input Vi of the resonance amplifier RA. The in-phase output VI of RA is coupled to the second input I12 of the first multiplier stage M1, while the quadrature output VQ of the resonance amplifier RA is coupled to the second input I22 of the second multiplier stage M2. Outputs of the first and second multiplier stages M1 and M2 are coupled to inputs of the first differential stage S1 in which the difference is formed between the output signals of M1 and M2.

As already stated hereinbefore, the resonance amplifier RA is known per se from European Patent Application 0 420 974. Particularly FIG. 4E of this Patent Application shows the resonance amplifier RA used as a polyphase filter of the phase quadrature filter type, as is shown in the present FIG. 1. The resonance amplifier RA operates, in the application shown, as a first and a second phase-shifting circuit from the in-phase input Vi to the in-phase output VI, and from the quadrature input Vq to the quadrature output VQ, respectively. When the pair of FM-modulated phase quadrature input signals is applied from the in-phase and quadrature terminals I and Q to the in-phase and quadrature inputs Vi and Vq of RA, FM-modulated signals in a mutual phase quadrature are produced at the in-phase and quadrature outputs VI and VQ of RA. As compared with the FM-modulated FM quadrature input signals of RA at the terminals Vi and Vq, these signals show a phase difference which varies in dependence upon the modulation signal fmod and which is equal to zero at the carrier frequency f0=fres (i.e. when there is no modulation signal fmod). Thus, a pair of FM-modulated input signals occur at the first and second inputs I11 and I12 of the first multiplier stage M1, which input signals have a mutual phase difference which is 90° at the carrier frequency f0 and which deviates from 90° and varies with the modulation signal fmod. Similarly, a pair of input signals occur at the inputs I21 and I22 of the second multiplier stage M2, which input signals also deviate 90° in phase at the carrier frequency f0 and have a mutual phase difference which with respect to 90° varies with the modulation signal fmod. A mutual multiplication of these two input signals in M1 and M2, respectively, results in a desired DC component at each output of M1 and M2. If square-wave phase quadrature FM-modulated input signals are assumed to occur at the in-phase and quadrature terminals I and Q, higher order interference components also occur at each output of M1 and M2. The desired DC components in the output signals of M1 and M2 vary in amplitude with the baseband modulation signal fmod of the FM-modulated input signals and are mutually in phase opposition, while the second-order interference components occur with an equal phase around an average of 2f0. In the differential stage S1, the desired DC components occurring in the output signals of M1 and M2 are added together, while the second-order interference components are subtracted from each other. Consequently, said second-order interference components are absent in the output signal of the differential stage S 1 and the higher order interference component which is next in frequency occurs at an average frequency of 4f0. This fourth-order interference component is followed at a large frequency interval by a series of higher order interference components which are much smaller in amplitude and rapidly decrease with an increasing order. Due to the comparatively wide frequency interval between said fourth-order interference component and the desired DC component, the low-pass filter LF may be of a considerably lower order than is necessary in the known FM quadrature demodulator so as to realise an effective suppression of these higher order interference components.

Figure 5:
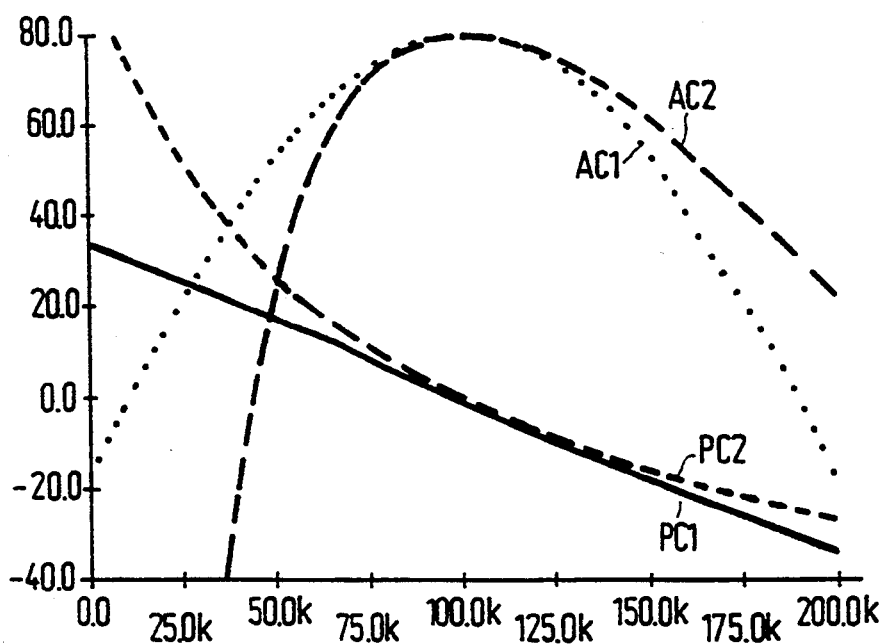
FIG. 5 shows amplitude and phase characteristics of a conventional LC filter and a resonance amplifier.

As is known from the last-mentioned European Patent Application 0 420 974, the resonance amplifier RA has a symmetrical bandpass characteristic and a point symmetrical phase transfer characteristic around the resonant frequency fres. FIG. 5 shows these characteristics by means of curves AC1 and PC1 and, for the purpose of comparison, corresponding characteristics of a conventional LC filter are shown by means of curves AC1 and AC2, respectively, each around the same resonant frequency fres. Curves AC1 and AC2 clearly illustrate that the resonance amplifier RA has a symmetrical bandpass characteristic around fres and a conventional LC filter has an asymmetrical bandpass characteristic around fres. Curves PC1 and PC2 illustrate that the resonance amplifier RA has a point symmetrical phase transfer characteristic around fres and a conventional LC filter has a more or less quadratic phase transfer characteristic around fres.

Due to the symmetrical bandpass characteristic RA, amplitude variations as a result of the frequency modulation are avoided. This provides the possibility of applying sinusoidal signals to the second inputs I12 and I22 of M1 and M2 so that a reduction of the higher order interference components in the output signals of M1 and M2 is obtained. If the signals applied from the terminals I and Q to the first inputs I11 and I21 of M1 and M2 are also sinusoidal, there will be no higher order interference components and the low-pass filter LF may be dispensed with.

Moreover, the symmetrical and asymmetrical bandpass characteristics of RA and said conventional LC circuit, respectively, have the result that amplitude-modulated input noise, which occurs, for example when no input signal is applied, results in an average output noise level which does not have any deviation or a significant deviation, respectively with respect to the value obtained at the resonant frequency fres, viz. zero. Consequently, weak input signals occasionally disappearing in the noise when using a resonance amplifier as a phase-shifting circuit instead of a conventional LC circuit, will not give rise to pulsatory disturbances.

The point-symmetrical phase transfer characteristic of RA around fres further results in a phase shift which varies more linearly with the frequency than is possible when using a conventional LC circuit as a phase-shifting circuit. Consequently, the second and all further higher even order distortion components, which are inevitably produced when using an LC circuit due to its said quadratic phase transfer characteristic around fres, are avoided when using the resonance amplifier.

The above-mentioned compensation of the second-order interference components in the first differential stage S1, as well as the improvements, obtained by means of the symmetrical bandpass and point-symmetrical phase transfer characteristics of RA, of the demodulation effect of the FM quadrature demodulator according to the invention as compared with those of the known FM quadrature demodulator are also obtained without the shown control of the tuning of RA, i.e. without feeding back the output signal from LF to It of RA.

In such an embodiment (not shown) of an FM quadrature demodulator according to the invention, in which in contrast to the embodiment shown in FIG. 1, there is no tuning control of RA, the output signal of the low-pass filter LF is applied to the detector output after a possible amplification. Since the tuning frequency fres of RA does not track the modulation signal fmod, RA should thus have a sufficiently wide band to comprise the full frequency swing delta f of the FM-modulated phase quadrature input signals due to fmod. However, the tuning frequency of the FM quadrature demodulator may be chosen to be relatively low as a result of the use of a resonance amplifier as a polyphase filter, for example of the order of magnitude of said frequency swing delta f, because such a resonance amplifier in its use as a phase quadrature filter also has a symmetrical bandpass characteristic around fres at a low value of the resonant frequency fres. This provides the possibility of a simple integration of the FM quadrature demodulator.

In the embodiment shown, use is made of the aspect that the low-pass filter LF is of a comparatively low order and can be incorporated in a tuning control loop without any risk of instability. The output of the first differential stage S1 is coupled to the tuning control input It of the resonance amplifier RA via a tuning control path successively incorporating the loop amplifier LA, the low-pass filter LF operating as a loop filter, the amplifier-limiter or soft limiter SL and the second differential stage S2. Together with the resonance amplifier RA, the first and second multiplier stages M1 and M2 and the first differential stage S1, this tuning control path forms a tuning control loop via which the tuning of RA dynamically follows the instantaneous frequency fmom of the pair of FM-modulated phase quadrature input signals at the terminals I and Q. It is known from the afore-mentioned EP 0 420 974 that the tuning of a polyphase filter of the resonance amplifier type varies linearly with the tuning control signal at the tuning control input It.

As mentioned hereinbefore, the frequency setting signal F0 is suitably combined in S2 with the baseband modulation signal fmod which is applied from LF via SL to S2 so as to form a tuning control signal Fc for said dynamic variation of the resonant frequency fres of RA. This tuning control signal Fc varies the resonant frequency fres of RA instantaneously in dependence upon the frequency modulation of the FM-modulated input signals at the terminals I and Q so that frequency differences between the FM-modulated input signals applied to Vi and Vq of RA, on the one hand, and the resonant frequency fres of RA, on the other hand, are negatively fed back in said tuning control loop and consequently reduced. A dynamic frequency tracking of the resonance amplifier RA is obtained with the tuning control loop so that this amplifier can be formed with a considerably narrower band than without the tuning control loop. Consequently, the accuracy of the phase quadrature relation between the two phase quadrature FM signals applied to the second inputs I12 and I22 of M1 and M2, respectively, is enhanced. This improves the demodulation linearity. Moreover, such a narrow-band resonance amplifier RA can be realized in a simple manner.

As stated hereinbefore, Fc comprises the desired baseband modulation signal fmod applied by the amplifier-limiter SL to the second differential stage S2. The level of limitation of the amplifier-limiter SL is chosen to have an amplitude value which causes a deviation of the resonant frequency fres with respect to the carrier frequency f0 in the resonance amplifier RA, which deviation corresponds to the order of magnitude of the maximum occurring frequency deviation delta f of the FM-modulated input signals at the terminals I and Q with respect to this carrier frequency f0. If the FM quadrature demodulator is used in an FM radio receiver, this level of limitation is to correspond to a frequency deviation of the order of magnitude of 75 kHz. It is thereby prevented that the tuning control loop captures a neighboring transmitter as a result of possible resonant rise in the loop or a carrier frequency of this neighboring transmitter instantaneously coming close to the modulated carrier frequency f0 of the desired transmitter.

It will be evident that the invention is also applicable without the supply of the frequency setting signal F0, for example, by correctly dimensioning the FM quadrature demodulator and/or by setting the tuning of the FM quadrature demodulator by means of a fixed bias voltage at It of RA. The second differential stage S2 may then be dispensed with. It is further possible to derive the pair of FM-modulated phase quadrature input signals at the terminals I and Q from a single-phase input signal. This can be realised in a manner known per se, as shown, for example in the first-mentioned Patent Specification DE 2636268 by means of a differentiator and a limiter, or in a manner as shown in FIG. 2 which will be further dealt with hereinafter.

In the shown feedback implementation of the FM quadrature demodulator according to the invention, it may be favorable under circumstances to incorporate limiter circuits between the outputs VI and VQ of RA and the second inputs I12 and I21 of M1 and M2, respectively. These limiter circuits prevent possible amplitude variations in the output signals RA due to the tuning control.

A very rapid tuning control can be obtained by dispensing with the lowpass filter LF operating as a loop filter. To render this possible, the occurrence of higher order interference components should be avoided as much as possible by preventing signal limitations and by presenting sinusoidal signals to the terminals I and Q.

Figure 2:
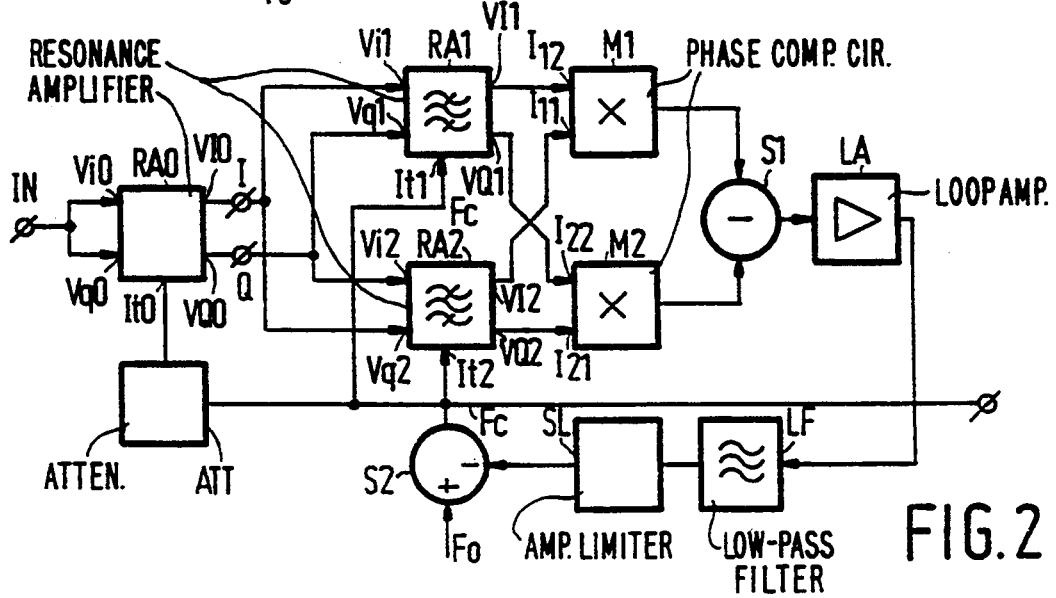
FIG. 2 shows a second embodiment of an FM quadrature demodulator according to the invention.

FIG. 2 shows a second embodiment of an FM quadrature demodulator according to the invention in which circuits having identical functions as those of FIG. 1 have the same reference symbols. Unlike the circuit of the previous Figure, FIG. 2 shows a first and a second resonance amplifier RA1 and RA2 and a resonance amplifier RA0 operating as a phase splitter. The first resonance amplifier RA1 corresponds to the resonance amplifier RA of FIG. 1. RA2 operates as a third phase-shifting circuit from in-phase input Vi2 to in-phase output VI2 and as a fourth phase-shifting circuit from quadrature input Vq2 to quadrature output VQ2, corresponding in function to the aforementioned first and second phase-shifting circuits of RA in FIG. 1.

The resonance amplifier RA0 is used in the same form as shown in FIG. 4b in European Patent Application 420 974, i.e. as a phase splitter in which a single-phase FM-modulated input signal of the carrier frequency f0 and a frequency modulation signal fmod are split up into a pair of FM-modulated phase quadrature signals, likewise at the carrier frequency f0 each, and a frequency modulation signal fmod. To this end in-phase and quadrature inputs Vi0 and Vq0 of RA0 are coupled in common to an input IN of the FM quadrature demodulator, while in-phase and quadrature outputs VI0 and VQ0 of RA0 are connected to the terminals I and Q. The FM-modulated phase quadrature output signals of the phase splitter RA0 are sinusoidal, even if the FM-modulated input signal at IN is square-wave shaped. This means that RA0 used as a phase splitter in the embodiment Of FIG. 1 prevents the occurrence of higher order interference components. Such an application thus renders it possible to dispense with the lowpass filter LF and thereby to accelerate the tuning control.

In the embodiment shown in FIG. 2, the tuning control signal Fc is applied to the tuning control inputs of It0, It1 and It2 of RA0, RA1 and RA2, respectively. An attenuator circuit ATT is arranged between the second differential stage S2 and the tuning control input It0 of the phase splitter RA0 so as to prevent instabilities in the frequency control of the phase splitter RA0. The resonant frequency fres of RA0 instantaneously tracks the frequency-modulated input signal at the input IN due to this tuning frequency control. Consequently, an accurate phase quadrature relation between the two FM-modulated quadrature output signals of RA0 is obtained, even at a comparatively low resonant frequency fres.

For a satisfactory demodulation effect, the amplification in the first tuning control loop constituted by RA1, M1, M2, S1, LA, LF, SL and S2, on the one hand and, the amplification in the second tuning control loop constituted by RA2, M1, M2, S1, LA, LF, SL and S2, on the other hand, should be mutually different. This mutual difference can be obtained by choosing the tuning control slope of RA1 to be different from that of RA2 and/or by choosing the bandwidth of RA1 to be different from that of RA2, and/or by arranging loop amplifiers (not shown) with mutually different amplifications in the first and second tuning control loops. As a result of the use of resonance amplifiers in the two input signal paths of M1 and M2, sinusoidal input signals are applied to M1 and M2 so that the higher order interference components are completely absent at the outputs of M1 and M2.

It will be evident that the latter fact is not dependent on the use of a resonance amplifier as a phase splitter, due to the use of resonance amplifiers in the two signal paths of M1 and M2. This means that, if a high tuning control rate is desired, and also without a resonance amplifier as a phase splitter, the low-pass filter can be dispensed with in the present embodiment.

It will also be evident that the phase splitter RA0 can be used in the FM quadrature demodulator of FIG. 1, in which it can be incorporated upstream of the terminals I and Q. The tuning of RA0 may be controlled (not shown) from the second differential stage S2 via an attenuator circuit which corresponds to the attenuator circuit ATT.

Figure 3:
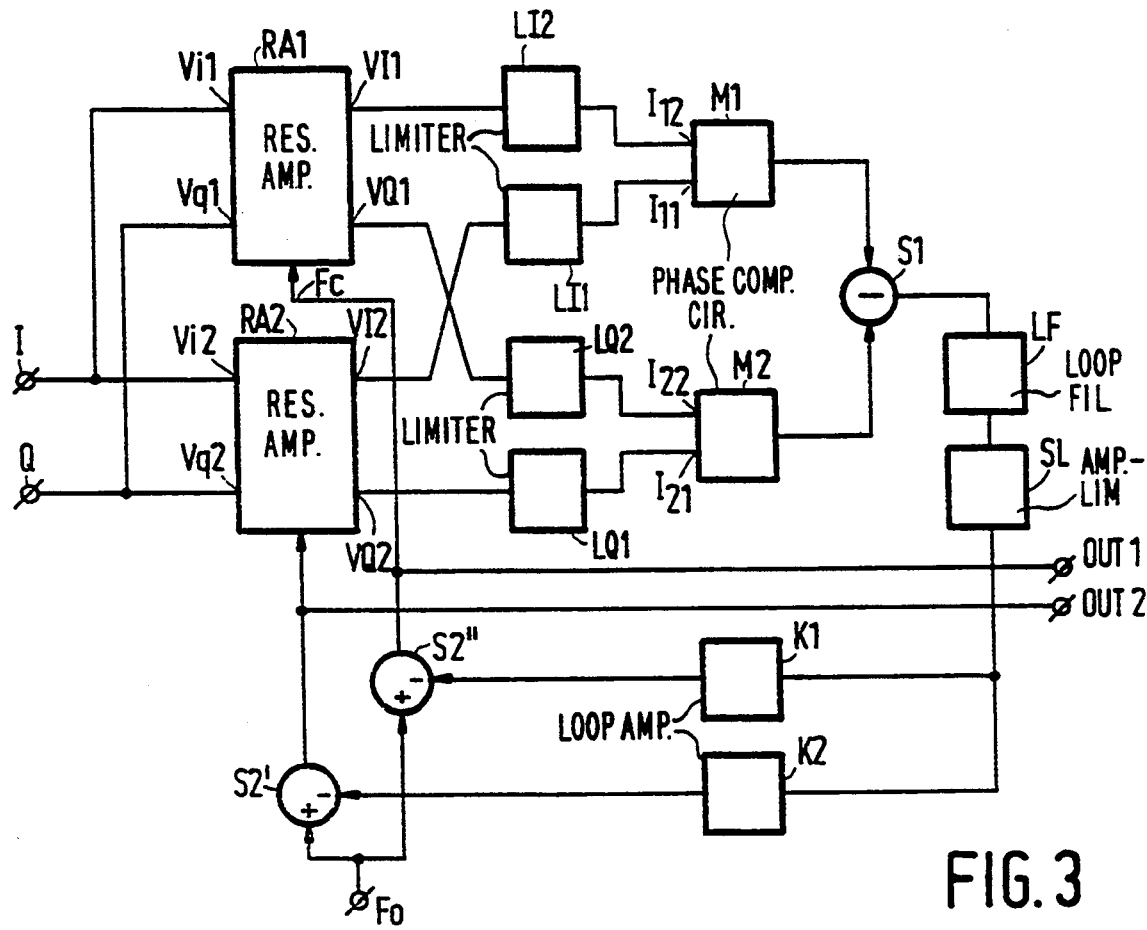
FIG. 3 shows a third embodiment of an FM quadrature demodulator according to the invention.

FIG. 3 shows a third embodiment of an FM quadrature receiver according to the invention in which circuits having identical functions as in the previous Figures have the same reference indications. Unlike the embodiment of FIG. 2, the FM quadrature receiver shown comprises several loop amplifiers in the first and second tuning control loops. The first tuning control loop, with RA1, incorporates a loop amplifier K1, while the second tuning control loop, with RA2, incorporates a second loop amplifier K2. The first and second loop amplifiers K1 and K2 are arranged between the amplifier-limiter SL and third and fourth differential stages S2' and S2" whose functions correspond to the second differential stage S2. For the sake of simplicity, the resonance amplifier RA0 operating as a phase splitter in FIG. 2 is omitted. In the embodiment shown, the first and second resonance amplifiers may have a similar structure. Limiter circuits LI1, LQ1, LI2 and LQ2 are arranged between the first and second resonance amplifiers RA1 and RA2 in each of the in-phase and quadrature outputs and the first and second inputs of M1 and M2, respectively. These limiter circuits prevent the elimination of amplitude variations caused as a result of a tuning variation of the resonance amplifiers RA1 and RA2. The outputs of the third and fourth differential stages S2' and S2" are further coupled to outputs OUT1 and OUT2 of the FM quadrature demodulator, which outputs may mutually have a different signal quality which is dependent on the signal condition.

It will be evident that the invention is not limited to the embodiments shown. As already mentioned hereinbefore with reference to FIG. 1 and while using the inventive idea, the tuning control paths from the output of the loop filter LF to the tuning control inputs RA1 and RA2 may also be dispensed with in FIGS. 2 and 3, the phase splitup with which a pair of phase quadrature FM-modulated input signals are obtained, starting from a single-phase input signal, can be realized in a different manner, and the soft limiter SL may be dispensed with or, if necessary, arranged upstream of the loop filter LF. Arrangement of SL between the loop filter and the tuning control input of the first and the second resonance amplifier has the advantage that resonant rise in the loop filter LF is eliminated.

Figure 4:
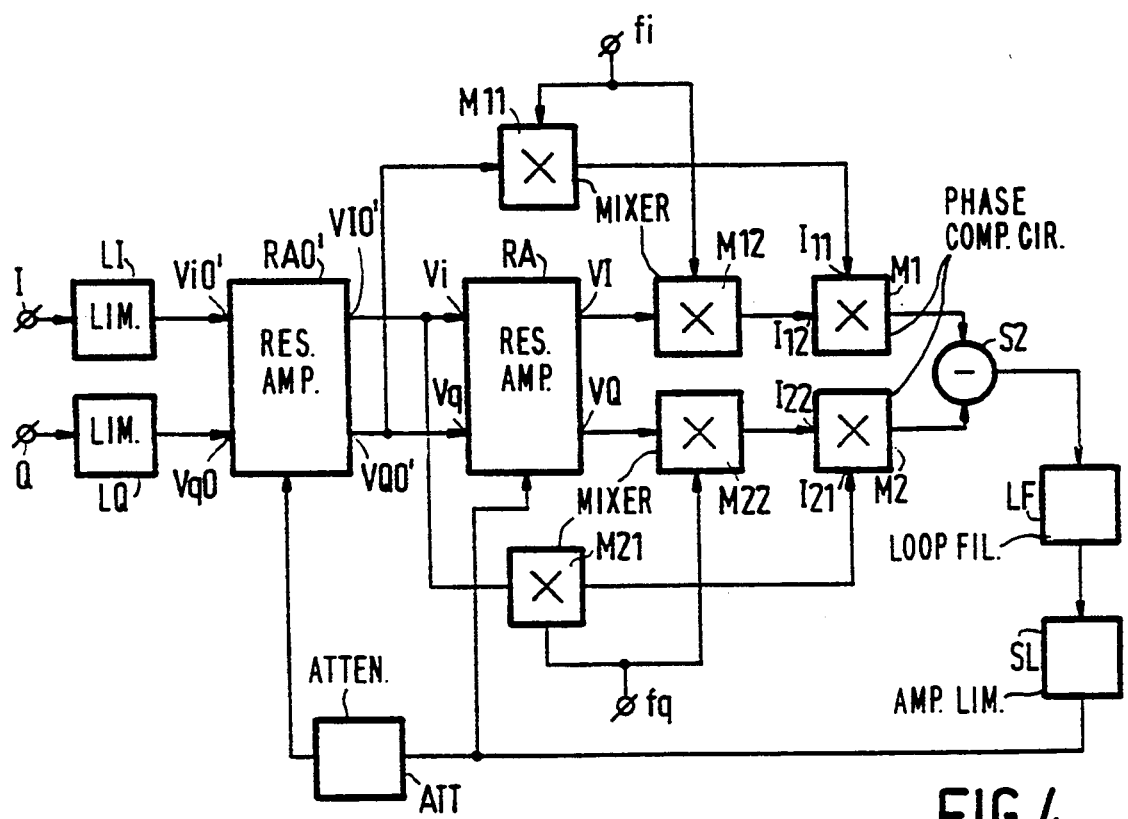
FIG. 4 shows a fourth embodiment of an FM quadrature demodulator according to the invention.

FIG. 4 shows a fourth embodiment of an FM quadrature demodulator according to the invention with an up-conversion of each of the two input signals of both the first and the second multiplier stage M1 and M2.

The up-conversion is realized by means of first and second mixer stages M11 and M12 which are coupled between the output VQO' of RAO' and the first input I11 of M1, and between the output VI of RA and the second input I12 of M1, respectively, and by means of third and fourth mixer stages M21 and M22 which are coupled between the output VIO' of RAO' and the second input I22 of M2 and between the output VQ of RA and the first input I21 of M1, respectively.

A common first mixing signal fi having a fixed mixing frequency fmix is applied to mixing inputs of M11 and M12, and a common second mixing signal fq having the same mixing frequency fmix is applied to mixing inputs of M21 and M22, which first and second mixing signals are in a mutual phase quadrature and are preferably sinusoidal. The second-order interference components occurring at the outputs of M1 and M2 are at 2(f0+fmix) from the desired DC component, while in the case of non-sinusoidal, for example, squarewave-shaped mixing signals, the fourth-order interference components occur at a frequency interval of 2(f0+fmix) from the desired DC component. This frequency space renders it possible to further simplify the lowpass filter.

In the embodiment shown the tuning of RAO' is dynamically controlled with the baseband modulation signal in the same way as RA0 in FIG. 2.

We claim:

1. An FM quadrature demodulator for demodulating a pair of FM-modulated signals in mutual phase quadrature, said FM-modulated signals including a modulation signal which is frequency-modulated on a carrier, said FM quadrature demodulator comprising:
an in-phase input terminal and a quadrature input terminal for receiving said FM-modulated signals;
a first phase comparison circuit having a first input coupled to said quadrature input terminal, a second input and an output;
a second phase comparison circuit having a first input coupled to said in-phase input terminal, a second input and an output;

phase shifting means comprising a polyphase filter having a bandpass characteristic which is symmetrical around the carrier frequency, said polyphase filter having in-phase and quadrature inputs coupled, respectively, to said in-phase and quadrature input terminals, and in-phase and quadrature outputs coupled, respectively, to said second inputs of said first and second phase comparison circuits, said phase shifting means realizing a phase shift which varies with said modulation signal;

a differential stage having inputs coupled, respectively, to the outputs of said first and second phase comparison circuits, and an output; and a low-pass filter having an input coupled to the output of said differential stage, an output of said low-pass filter being coupled to an output of said FM quadrature demodulator.

2. An FM quadrature demodulator as claimed in claim 1, characterized in that the polyphase filter comprises a first resonance amplifier having an in-phase input and a quadrature input coupled, respectively, to said in-phase and quadrature input terminals, said first resonance amplifier further having an in-phase output and a quadrature output coupled, respectively, to the second inputs of the first and second phase comparison circuits.

3. An FM quadrature demodulator as claimed in claim 2, characterized in that the first resonance amplifier is tunable and has a tuning control input for receiving a tuning control signal, said FM quadrature demodulator further comprising a tuning control loop having a first tuning control path via which said low-pass filter is coupled to the tuning control input of the first resonance amplifier.

4. An FM quadrature demodulator as claimed in claim 3, characterized in that the FM quadrature demodulator further comprises a second tunable resonance amplifier having an in-phase input coupled to the in-phase input terminal and a quadrature input coupled to the quadrature input terminal, said second tunable resonance amplifier further having an in-phase output and a quadrature output coupled, respectively, to the first inputs of said first and second phase comparison circuits, said second tunable resonance amplifier also having a tuning control input, said FM quadrature demodulator further comprising a second tuning control loop having a second tuning control path via which said low-pass filter is coupled to the tuning control input of the second resonance amplifier, said first tuning control loop having a loop gain which is different from a loop gain of said second tuning control loop.

5. An FM quadrature demodulator as claimed in claim 4, characterized in that a tuning control slope of the first tuning resonance amplifier is different from a tuning control slope of the second tunable resonance amplifier.

6. An FM quadrature demodulator as claimed in claim 5, characterized in that a bandwidth of the first tuning resonance amplifier is different from a bandwidth of the second tunable resonance amplifier.

7. An FM quadrature demodulator as claimed in claim 1, characterized in that said FM quadrature demodulator further comprises limiter circuits arranged, respectively, between each in-phase and quadrature output of at least the first resonance amplifier and each second input of the first and second phase comparison circuits.

8. An FM quadrature demodulator as claimed in claim 3, characterized in that said FM quadrature demodulator further comprises an amplifier-limiter coupled to an output of said low-pass filter, said amplifier-limiter having a level of limitation which is equivalent to the level of the tuning control signal at the order of magnitude of a maximum frequency deviation of the pair of FM-modulated phase quadrature signals.

9. An FM quadrature demodulator as claimed in claim 1, characterized in that the FM quadrature demodulator further comprises a third tunable resonance amplifier having in-phase and quadrature inputs coupled to a common input terminal of the FM quadrature demodulator, said third tunable resonance amplifier also having in-phase and quadrature outputs which are coupled, respectively, to said in-phase and quadrature input terminals, and a tuning control input, said FM quadrature demodulator further comprising an attenuator circuit coupling the output of the FM quadrature demodulator to the tuning control input of said third resonance amplifier.

* * * * *